US008674883B2

United States Patent
Yen et al.

(10) Patent No.: US 8,674,883 B2
(45) Date of Patent: Mar. 18, 2014

(54) ANTENNA USING THROUGH-SILICON VIA

(75) Inventors: Hsiao-Tsung Yen, Tainan (TW); Jhe-Ching Lu, Tainan (TW); Yu-Ling Lin, Taipei (TW); Chin-Wei Kuo, Zhubei (TW); Min-Chie Jeng, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 386 days.

(21) Appl. No.: 13/114,828

(22) Filed: May 24, 2011

(65) Prior Publication Data

US 2012/0299778 A1    Nov. 29, 2012

(51) Int. Cl.
*H01Q 1/38*    (2006.01)

(52) U.S. Cl.
USPC .................................................. 343/700 MS

(58) Field of Classification Search
USPC .................................................. 343/700 MS
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,462,712 B1 * | 10/2002 | Liang | 343/700 MS |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,731,243 B2 * | 5/2004 | Taira et al. | 343/700 MS |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |

(Continued)

FOREIGN PATENT DOCUMENTS

| | | |
|---|---|---|
| JP | 5327331 | 12/1993 |
| JP | 2006128902 | 5/2006 |
| KR | 10-2009-0045912 | 5/2009 |

OTHER PUBLICATIONS

Office Action dated Oct. 26, 2013 from corresponding application No. KR 10-2011-0082239.

*Primary Examiner* — Seung Lee

(74) *Attorney, Agent, or Firm* — Lowe Hauptman & Ham, LLP

(57) ABSTRACT

An antenna includes a substrate and a top plate disposed over the substrate. At least one feed line is connected to the top plate, and each feed line comprises a first through-silicon via (TSV) structure passing through the substrate. At least one ground line is connected to the top plate, and each ground line comprises a second TSV structure passing through the substrate. The top plate is electrically conductive, and the at least one feed line is arranged to carry a radio frequency signal. The at least one ground line is arranged to be coupled to a ground.

20 Claims, 8 Drawing Sheets

(56) References Cited

U.S. PATENT DOCUMENTS

| | | |
|---|---|---|
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,821,460 B2 * | 10/2010 | Schillmeier et al. ... 343/700 MS |
| 7,855,696 B2 * | 12/2010 | Gummalla et al. ........... 343/876 |
| 8,432,316 B2 * | 4/2013 | Mitarai et al. ......... 343/700 MS |
| 2012/0162015 A1 * | 6/2012 | Chen et al. ............. 343/700 MS |
| 2012/0242547 A1 * | 9/2012 | Fujii et al. .............. 343/700 MS |

* cited by examiner

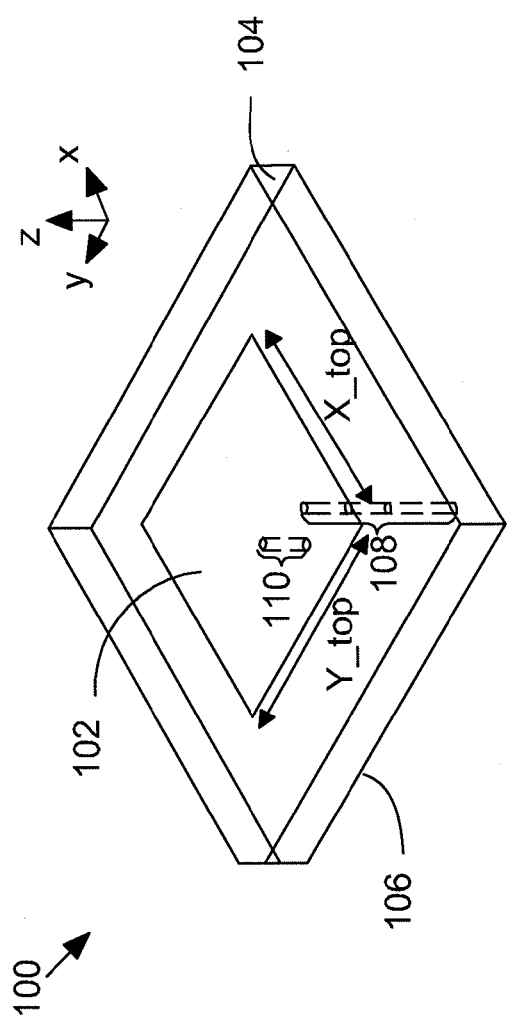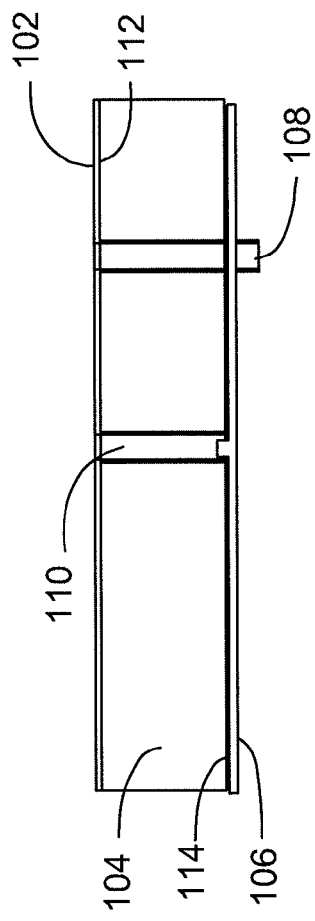
Fig. 1A
Fig. 1B

ANTENNA USING THROUGH-SILICON VIA

TECHNICAL FIELD

The present disclosure relates generally to an integrated circuit and, more particularly, to an antenna.

BACKGROUND

A conventional on-chip Planar Inverted F Antenna (PIFA) occupies a relatively large area compared to other parts of integrated circuits, e.g., for applications in the frequency range from 1 GHz to 30 GHz. The on-chip antenna has performance issues compared to Printed Circuit Board (PCB) antennas. For some on-chip antennas, a substrate functions as an initial ground, and with a high dielectric constant $\in_r$, tends to trap microwave signals. They could be used for transmission from die to die or die to PCB, or die to free space, to take place of either bond-wire, interconnects between die-to-die or die to PCB, or an antenna to free space itself.

BRIEF DESCRIPTION OF THE DRAWINGS

Reference is now made to the following descriptions taken in conjunction with the accompanying drawings, in which:

FIG. 1A is a schematic diagram showing a three-dimensional view of an exemplary Planar Inverted F Antenna (PIFA) according to some embodiments;

FIG. 1B is a schematic diagram showing a cross-sectional side view of the exemplary PIFA in FIG. 1A according to some embodiments;

DETAILED DESCRIPTION

Figure 2:
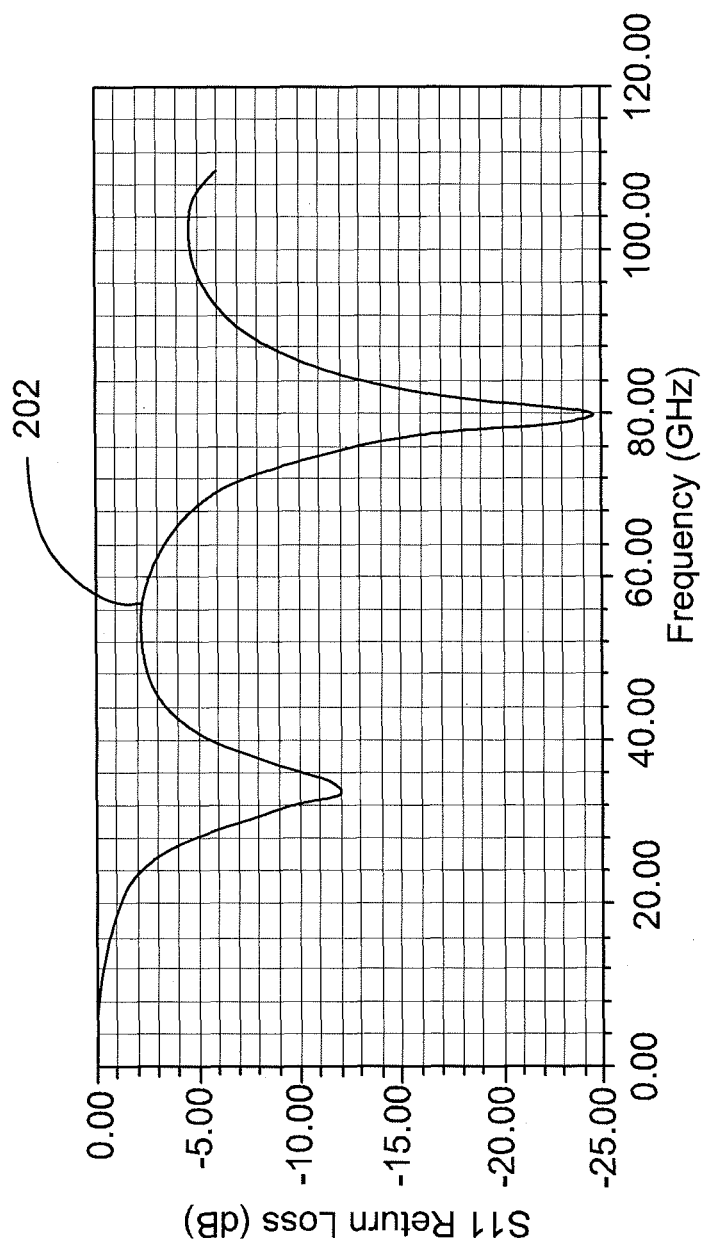
FIG. 2 is a plot showing a return loss performance of the exemplary PIFA in FIG. 1A according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

FIG. 1A is a schematic diagram showing a three-dimensional view of an exemplary Planar Inverted F Antenna (PIFA) according to some embodiments. The PIFA 100 includes a top plate 102 formed over a substrate 104. The top plate 102 is electrically conductive. In one example, the substrate 104 is a semiconductor wafer. In another example, the substrate 104 includes a semiconductor chip. In at least one embodiment, the substrate 104 includes silicon. In some other embodiments, the substrate 104 may alternatively or additionally include other elementary semiconductor, such as germanium. The substrate 104 may also include a compound semiconductor, such as silicon carbide, gallium arsenide, indium arsenide, indium phosphide, or any other suitable material.

The substrate 104 may include an epitaxial layer. For example, the substrate 104 may have an epitaxial layer overlying a bulk semiconductor. Further, the substrate 104 may be strained for performance enhancement. For example, the epitaxial layer may include semiconductor materials different from those of the bulk semiconductor such as a layer of silicon germanium overlying bulk silicon, or a layer of silicon overlying a bulk silicon germanium formed by a process including selective epitaxial growth (SEG). Furthermore, the substrate 104 may include a semiconductor-on-insulator (SOI) structure. In various examples, the substrate 104 includes a buried oxide (BOX) layer formed by a process such as separation by implanted oxygen (SIMOX).

In some embodiments, the substrate 104 can include various doped wells and other doped features configured and coupled to form various microelectronic devices such as metal-insulator-semiconductor field effect transistors (MOSFET) including complementary MOSFET (CMOS), imaging sensor including CMOS imaging sensors (CIS), micro-electro-mechanical systems (MEMS), and/or other suitable active and/or passive devices. The doped wells and other doped features include p-type doped region and/or an n-type doped region, formed by a doping process such as ion implantation.

Other structures such as gate dielectric and polysilicon gate electrodes may be additionally formed on the substrate 104 for devices such as MOSFET devices. The substrate 104 also includes various isolation features configured to separate various devices from each other for proper isolation. The isolation features may include different structures and can be formed by certain particular processing technologies. In one example, the isolation features include dielectric isolation such as shallow trench isolation (STI). The STI can be fabricated by etching the substrate to form a trench and filling the trench with a dielectric material.

A ground plate 106 is formed below the substrate 104. The ground plate 106 is electrically conductive. A feed line 108 using a through-silicon via (TSV) carries (couples) a radio frequency (RF) signal to/from the top plate 102 at a feed point (where the feed line 108 is connected to the top plate 102). The RF signal can be transmitted by an RF transmitter and/or received by an RF receiver. A TSV is a vertical electrical connection passing through a (silicon) wafer or die, e.g., the substrate 104. TSV technology is important in creating 3-dimensional (3D) packages and 3D integrated circuits. A 3D package, e.g. system in package, chip-stack multi-chip module (MCM), etc., contains two or more chips (integrated circuits) stacked vertically so that they occupy less space.

In edge-wired 3D packages, the stacked chips are wired together along their edges; this edge wiring slightly increases the length and width of the package and usually requires an extra interposer layer between the chips. In TSV 3D packages, the TSV replaces edge wiring by creating vertical connections through the body of the chips, providing a more compact package. In addition, critical electrical paths through the device can be shortened, leading to faster operation.

A ground line 110 using a TSV couples electrical ground to the top plate 102 at a ground point (where the feed line 110 is connected to the top plate 102). In one implementation, the top plate 102 has an area of 530 µm×530 µm. The position (x, y) of the feed point is at (150 µm, 100 µm), and the ground point is at (200 µm, 150 µm). The length of TSV may depend on the thickness of the substrate 104, and can be about 100 µm in some embodiments. The TSV inner radius may be 6 µm-12 µm, and the TSV outer radius may be about 13 µm in some embodiments.

FIG. 1B is a schematic diagram showing a cross-sectional side view of the exemplary PIFA in FIG. 1A according to some embodiments. The top plate 102 is implemented as a metal layer over the substrate 104, and an isolation layer 112 electrically isolates the top plate 102 from the substrate 104. Also, another isolation layer 114 electrically isolates the ground plate 106 from the substrate 104. The ground plate 106 is implemented as a metal layer below the substrate 104 in one example. The feed line 108 and ground line 110 are implemented using TSVs through the substrate 104. In one example, the substrate 104 is made of silicon (Si). The isolation layers 112 and/or 114 can include dielectric materials.

The top plate 102 can be any metal layer among multiple metal layers formed over the substrate 104. Also, the ground plate 106 can be any metal layer among multiple metal layers formed under the substrate 104. The metal layer may include electrically conductive materials such as copper, copper alloy, aluminum, aluminum/silicon/copper alloy, titanium, titanium nitride, tantalum, tantalum nitride, tungsten, polysilicon, metal silicide, any combinations thereof, or any other suitable material.

The metal layers can be formed by a process including physical vapor deposition (PVD such as PVD by sputtering), chemical vapor deposition (CVD), plating, damascene processes, combinations thereof, or any other suitable processes. Other manufacturing techniques may include photolithography processing and etching to pattern the electrically conductive materials for vertical (via and contact) and horizontal connects (electrically conductive line). In some embodiments, still other manufacturing processes such as thermal annealing may be used to form metal silicide to reduce contact resistance. The metal silicide used in multilayer interconnects may include nickel silicide, cobalt silicide, tungsten silicide, tantalum silicide, titanium silicide, platinum silicide, erbium silicide, palladium silicide, any combinations thereof, or any other suitable material.

The isolation layers 112 and/or 114 using dielectric materials can be an interlayer dielectric (ILD) disposed between the substrate 104 and a metal layer, or an inter-metal dielectric (IMD) disposed between adjacent metal layers. The dielectric material may include silicon oxide, silicon nitride, silicon oxynitride, spin-on glass (SOG), silicon dioxide, fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric material, in some alternative embodiments, includes a material of a low dielectric constant (low k) such as a dielectric constant less than about 3.5. The dielectric material features can be formed by a technique including spin-on coating, CVD, or any other suitable processes.

The PIFA 100 has a compact size partly due to the high dielectric constant k of the silicon substrate 104, e.g., about 11.7, compared to some other material, e.g., about 3.9 of Silicon dioxide (i.e., a slow-wave effect). Applications of the PIFA 100 can be for the mm wave region, e.g., from 30 GHz to 300 GHz. Because of the compact size (the PIFA 100 length can be smaller than 1 mm), the PIFA 100 can be used, e.g., in mobile applications. The PIFA 100 can provide a half-wavelength and a quarter-wavelength radiation in some embodiments as described below in FIG. 2.

The ground line 110 can be located close to an edge of the top plate 102 in some embodiments. In other embodiments, the ground line 110 can be located close to the center of the top plate 102. This has the effect of extending the top plate 102 beyond a ground line 110 previously located at an edge of the top plate 102, and allow the antenna to radiate at both a half-wavelength and a quarter-wavelength.

The PIFA 100 using a TSV through the substrate 104 has less parasitic elements (e.g., inductance or capacitance), compared to a PIFA implemented all above the substrate 104. The TSV structure not only provides a connection through the substrate 104, but also provides a part of the PIFA 100, e.g., the feed line 108 and the ground line 110. Thus, the fabrication of PIFA 100 can be integrated with a Complementary Metal-Oxide-Semiconductor (CMOS) process flow. Further, a die to die transmission is possible using a 3-dimensional (3D) stack packaging that can feed a signal through the feed line (TSV) 108 instead of a bond-wire. In other embodiments, micro bond-wire can be used to couple the feed line (TSV) 108 to another die, e.g., for the 3D packaging.

For the PIFA 100, the substrate 104 is floating, and the ground plate 106 is farther away from the top plate 102 (e.g., about 100 µm in some embodiments due to the thickness of the substrate 104). A radio frequency (RF) wave signal can be radiated more easily, compared to a PIFA having only 2-3 µm separation between the ground plate 106 and the top plate 102.

FIG. 2 is a plot showing a return loss performance of the exemplary PIFA in FIG. 1A according to some embodiments. The return loss (S11 parameter) plot 202 of the PIFA 100 in FIG. 1A shows a half-wavelength frequency at about 34 GHz, and a quarter-wavelength frequency at 80 GHz. The exemplary PIFA 100 have a size of 530 µm×530 µm and the silicon substrate had a dielectric constant of about 11.9 with a return loss of about −25 dB at 80 GHz. In contrast, an exemplary PIFA implemented on a PCB has a size of 853 µm×853 µm with a return loss of only about −7 dB. Thus, the exemplary PIFA 100 has a more compact size and better return loss performance.

FIG. 3A-FIG. 3D are schematic diagrams showing top views of different implementations of the exemplary PIFA in FIG. 1A according to some embodiments. The frequency and return loss performance can be changed by different shapes of the top plate 102 and different locations of the feed line 108 and the ground line 110, which can be verified using a simulation tool.

Figure 3B:
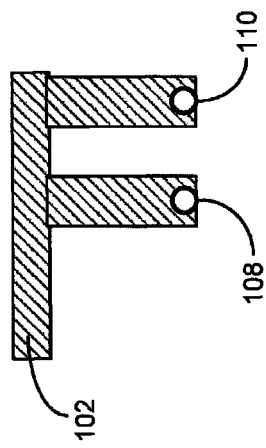
FIG. 3A-FIG. 3D are schematic diagrams showing top views of different implementations of the exemplary PIFA in FIG. 1A according to some embodiments.
Figure 3D:
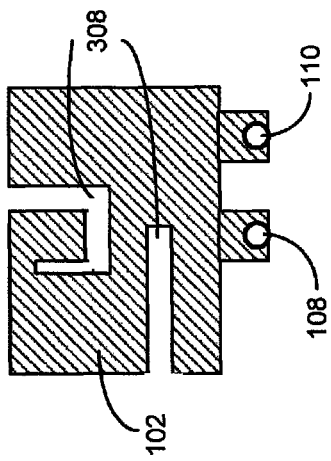
Figure 3A:
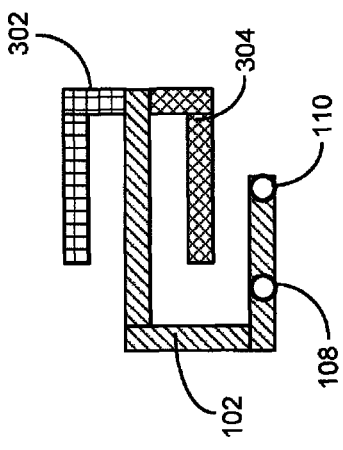

FIG. 3A is a top view of an exemplary PIFA having a spiral or meander shape. The top plate 102 can have an extension 302 for a meander shape or an extension 304 for a spiral shape. The feed line 108 and ground line 110 are also shown. The meander and/or spiral shape can be used for a compact size antenna. The spiral shape can be even smaller than the meander shape, but the directivity is stronger than the meander shape. For applications that require radiation in a particular direction and with a very compact size, the spiral shape can be used.

FIG. 3B is a top view of an exemplary PIFA having a folded shape. The top plate 102, the feed line 108, and ground line 110 are shown. The folded shape can be also used for a compact size. The folded shape allows the main part of the top plate 102 to be some distance away from the feed line 108 and the ground line 110 for better performance. However, since the routing area is getting larger, it may not be preferred for higher frequency applications or for a more compact size.

Figure 3C:
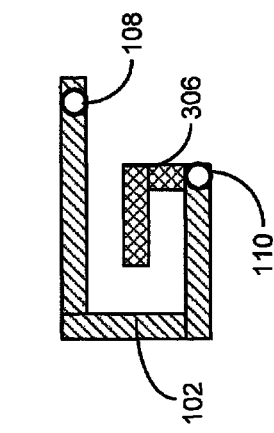

FIG. 3C is a top view of an exemplary PIFA having a spiral shape. The locations of the feed line 108 and ground line 110 are different from the PIFA in FIG. 3A. The extended top plate 306 beyond the ground line 110 and a different feed line 108 location result in different coupling between the feed line 108 and the ground line 110 and can be used for fine-tuning the performance of the spiral shape and/or meander shape of FIG. 3A.

FIG. 3D is a top view of an exemplary PIFA having a slotted top plate 102. The shape of the slots 308 are not limited to the shape in FIG. 3D. The slots 308 change the current distribution in the top plate 102 and facilitates to produce another bandwidth, e.g., for a dual band application. This type could be used for shunt metal layers, e.g., metal layers 1 and 2, metal layers 2 and 3, or metal layers 1, 2, and 3, to reduce the impedance of the antenna, which might impact the performance.

In addition, more than one feed line 108 and/or more than one ground line 110 can be used in some embodiments. The top plate 102 and/or ground plate 106 can be implemented on more than one metal layer in some embodiments. In some applications, no ground plate 106 is used.

Figure 4:
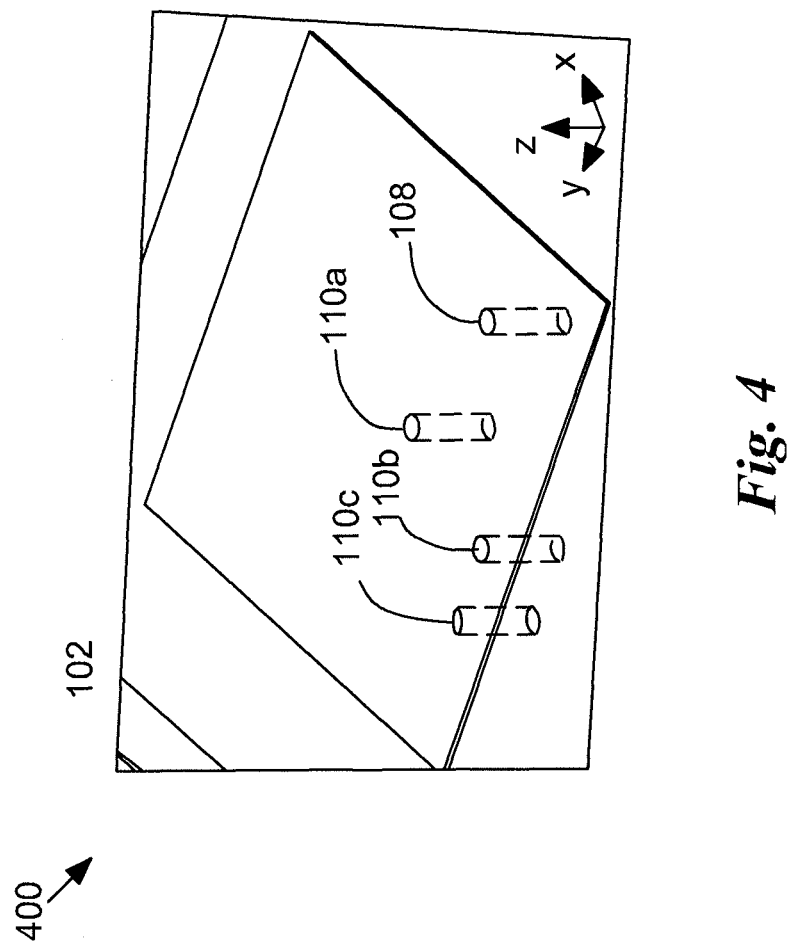
FIG. 4 is a schematic diagram showing a three-dimensional view of various exemplary implementations of the exemplary PIFA in FIG. 1A according to some embodiments.

FIG. 4 is a schematic diagram showing a three-dimensional view of various exemplary implementations of the exemplary PIFA in FIG. 1A according to some embodiments. The PIFA 400 includes a feed line 108 and three ground lines 110a, 110b, and 110c for different implementations. The size of the top plate 102 is 530 μm×530 μm. One implementation includes one ground line 110a at the (x, y) position of (150 μm, 200 μm). Another implementation has another ground line 110b at (50 μm, 300 μm) in addition to 110a. Yet another implementation includes another ground line 110c at (50 μm, 380 μm), in addition to 110a and 110b. Varying the ground line (TSV) in numbers and/or locations changes the performance of the PIFA 400 as described below.

Figure 5:
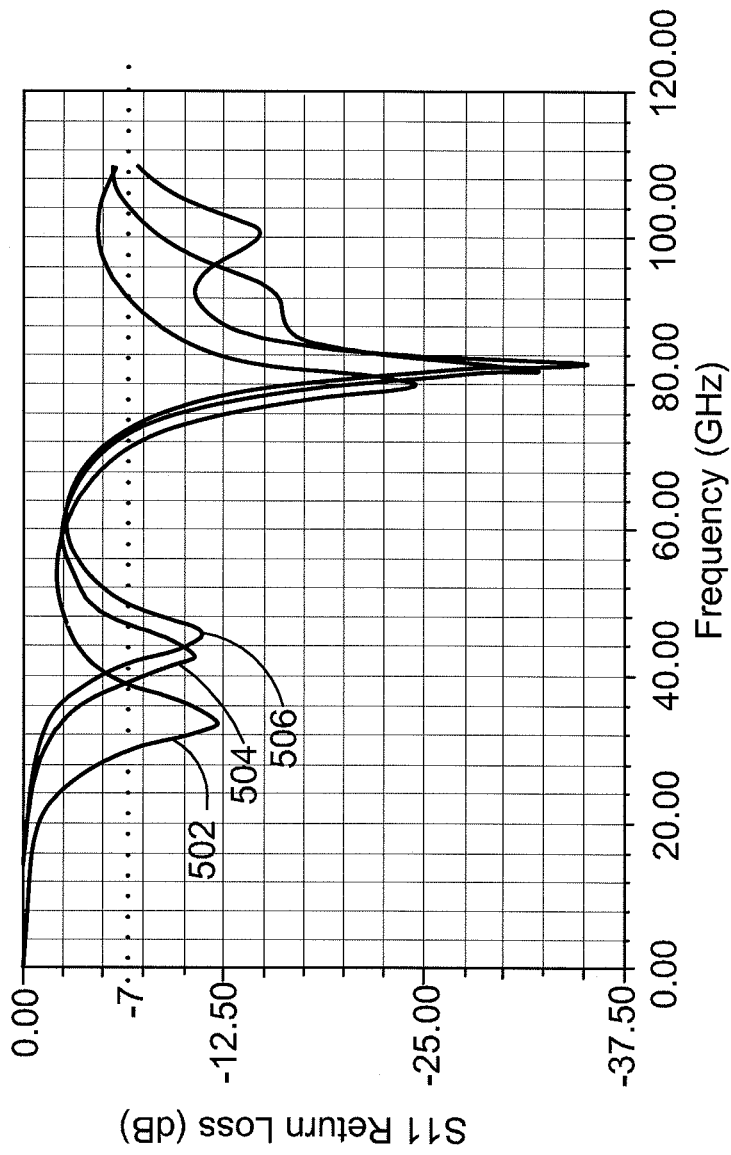
FIG. 5 is a plot showing a return loss performance of the exemplary PIFA in FIG. 4 according to some embodiments.

FIG. 5 is a plot showing a return loss performance of the exemplary PIFA in FIG. 4 according to some embodiments. The return loss (S11 parameter) plot 502 of the PIFA having one ground line 110a has a half-wavelength frequency at about 34 GHz, while the return loss plot 504 of the PIFA having two ground lines 110a and 110b has the frequency at about 43 GHz, and the return loss plot 506 of the PIFA having three ground lines 110a, 110b, and 110c has the frequency at about 46 GHz. The return loss values were within about 2.5 dB of each other.

Also, the return loss plot 502 of the PIFA having one ground line 110a has a quarter-wavelength frequency at about 80 GHz (about −25 dB), while the return loss plot 504 of the PIFA having two ground lines 110a and 110b has the frequency at about 82 GHz (about −32.5 dB), and the return loss plot 506 of the PIFA having three ground lines 110a, 110b, and 110c has the frequency at about 83 GHz (about −35 dB). FIG. 5 shows that by varying the number of ground lines (at different locations), the return loss and frequency can be changed.

Figure 6:
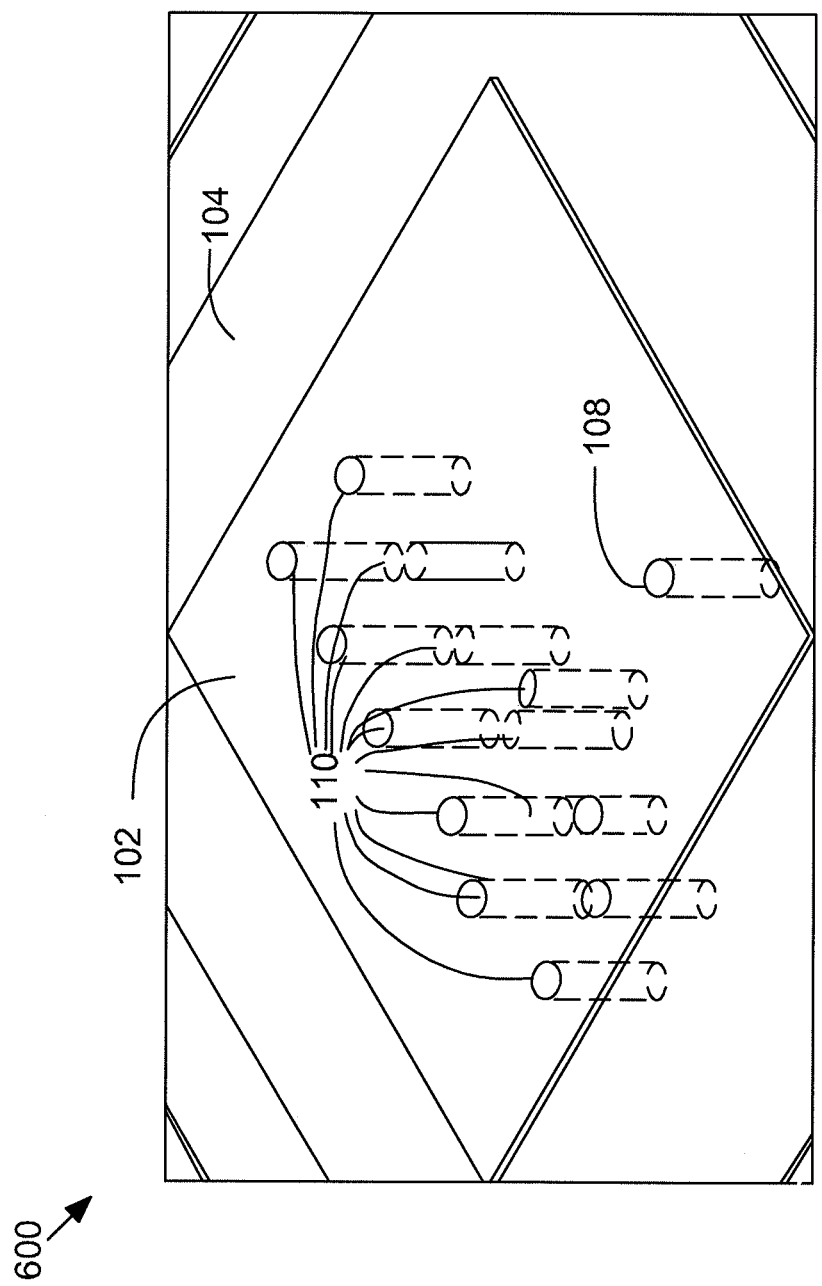
FIG. 6 is a schematic diagram showing a three-dimensional view of yet another implementation of the exemplary PIFA in FIG. 1A according to some embodiments.

FIG. 6 is a schematic diagram showing a three-dimensional view of yet another implementation of the exemplary PIFA in FIG. 1A according to some embodiments. The PIFA 600 has one feed line 108 and an array of ground lines 110. The ground lines 110 (using TSVs) are used to cancel certain negative current paths on the top plate 102 of PIFA 600. In some embodiments, the PIFA gain can be made larger using more ground lines (using TSVs). An antenna designing/simulation tool can be used to design and/or verify in order to meet certain specifications for the PIFA antenna. An array of feed lines 108 similar to the array of ground lines 110 in FIG. 6 can be used, or the ground lines 110 and/or feed lines 108 can be arranged in a line in other embodiments. In one embodiment, a minimum layout pitch (e.g., 80 μm) can be used for the ground/feed line array pitch.

Figure 7:
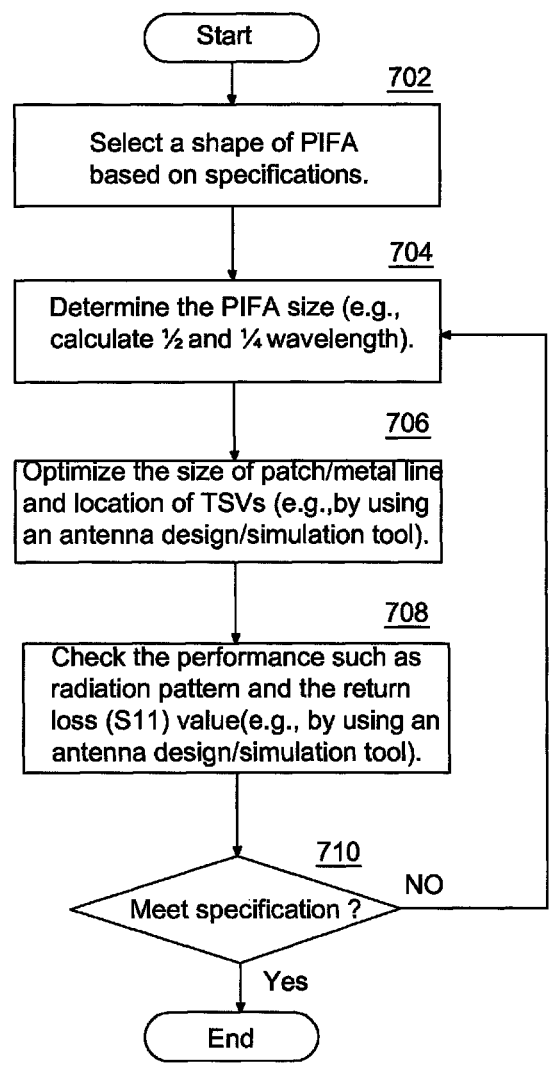
FIG. 7 is a flowchart of designing the exemplary PIFA in FIG. 1A according to some embodiments.

FIG. 7 is a flowchart for designing the exemplary PIFA in FIG. 1A according to some embodiments. At step 702, a shape of the PIFA is selected based on specifications. For example, the available antenna area for a fabrication process, and available metal layers, etc., can be considered for the selection in addition to the characteristics of each shape as described above for FIG. 3A-FIG. 3D.

At step 704, the PIFA size is determined. For example, a half-wavelength and/or a quarter-wavelength of the intended signal frequency can be calculated to determine the PIFA size. At step 706, the size of top plate 102 and metal lines, and the location of TSVs are optimized for the specifications. For example, an antenna design/simulation tool can be used for this step. At step 708, the performance such as radiation pattern and the return loss (S11) value are checked, e.g., by using an antenna design/simulation tool. At step 710, if the performance meets the specifications, the design is finished. If not, go back to step 704 to refine the design.

Figure 8:
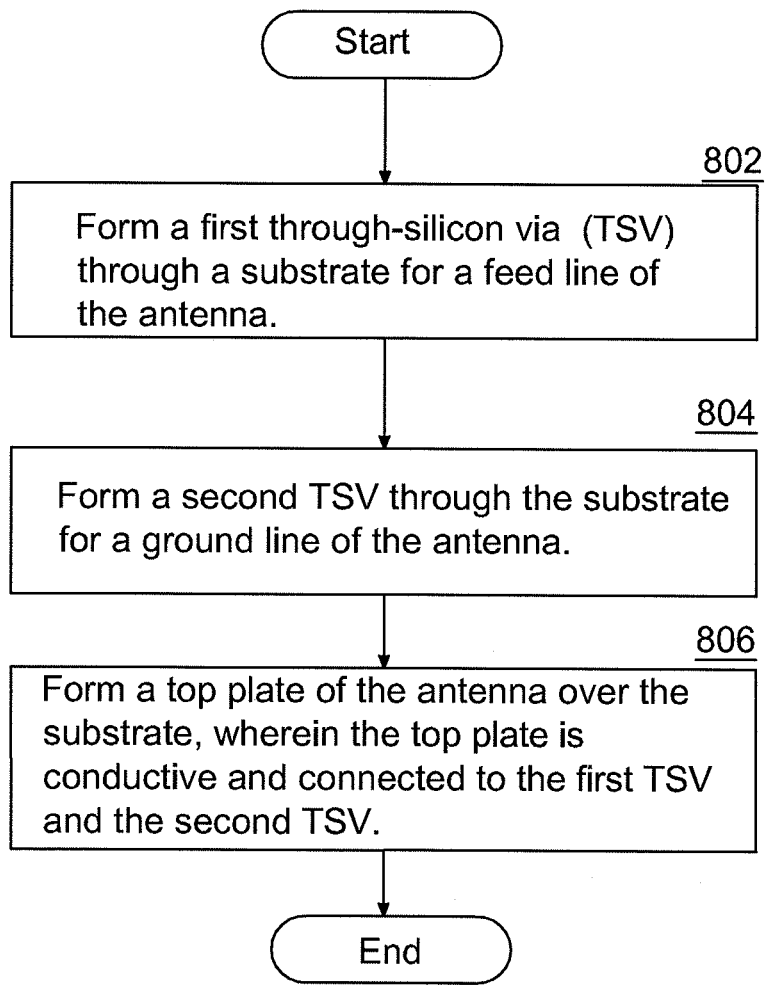
FIG. 8 is a flowchart of implementing the exemplary PIFA in FIG. 1A according to some embodiments.

FIG. 8 is a flowchart for implementing the exemplary PIFA in FIG. 1A according to some embodiments. At step 802, a first through-silicon via (TSV) is formed through a substrate for a feed line of the antenna. At step 804, a second TSV is formed through the substrate for a ground line of the antenna. At step 806, a top plate of the antenna is formed over the substrate, wherein the top plate is electrically conductive and connected to the first TSV and the second TSV.

In various embodiments, an isolation layer is formed over the substrate prior to forming the top plate. A ground plate of the antenna is formed under the substrate, wherein the ground plate is electrically conductive and connected to the second TSV. An isolation layer is formed under the substrate prior to forming the ground plate. Another TSV can be formed through the substrate for the feed line of the antenna or for the ground line of the antenna. The first TSV is coupled to another die stacked below the substrate in a 3-dimensional (3D) packaging.

According to some embodiments, an antenna includes a substrate and a top plate disposed over the substrate. At least one feed line is connected to the top plate, and each feed line comprises a first through-silicon via (TSV) structure passing through the substrate. At least one ground line is connected to the top plate, and each ground line comprises a second TSV structure passing through the substrate. The top plate is electrically conductive, and the at least one feed line is arranged to carry a radio frequency signal. The at least one ground line is arranged to be coupled to a ground.

According to some embodiments, a method of implementing an antenna includes forming a first through-silicon via (TSV) through a substrate for a feed line of the antenna. A second TSV is formed through the substrate for a ground line of the antenna. A top plate of the antenna is formed over the substrate, wherein the top plate is electrically conductive and connected to the first TSV and the second TSV.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An antenna comprising:
    a substrate;
    a top plate disposed over the substrate;
    at least one feed line connected to the top plate, each feed line comprising a first through-silicon via (TSV) structure passing through the substrate; and
    at least one ground line connected to the top plate, each ground line comprising a second TSV structure passing through the substrate,
    wherein the top plate is electrically conductive, the at least one feed line is arranged to carry a radio frequency signal, and the at least one ground line is arranged to be coupled to a ground.

2. The antenna of claim 1, wherein the top plate comprises multiple metal layers.

3. The antenna of claim 1, further comprising a ground plate disposed below the substrate, wherein the ground plate is electrically conductive and coupled to the at least one ground line.

4. The antenna of claim 3, wherein the ground plate comprises multiple metal layers.

5. The antenna of claim 1, wherein the at least one ground line is disposed at an edge of the top plate.

6. The antenna of claim 1, wherein the at least one ground line is disposed close to a center of the top plate.

7. The antenna of claim 1, wherein the at least one ground line is arranged in an array or in a line.

8. The antenna of claim 1, wherein the at least one feed line is arranged in an array or in a line.

9. The antenna of claim 1, wherein the at least one feed line is coupled to another die stacked below the substrate in a 3-dimensional (3D) packaging using the first TSV structure.

10. The antenna of claim 1, wherein the at least one feed line is coupled to another die using a micro bond-wire.

11. The antenna of claim 1, wherein the top plate has a rectangular shape.

12. The antenna of claim 11, wherein the top plate has slots inside the rectangular shape.

13. A method of implementing an antenna comprising:
    forming a first through-silicon via (TSV) through a substrate for a feed line of the antenna;
    forming a second TSV through the substrate for a ground line of the antenna; and
    forming a top plate of the antenna over the substrate, wherein the top plate is electrically conductive and connected to the first TSV and the second TSV.

14. The method of claim 13, further comprising forming an isolation layer over the substrate prior to forming the top plate.

15. The method of claim 13, further comprising forming a ground plate of the antenna under the substrate, wherein the ground plate is electrically conductive and connected to the second TSV.

16. The method of claim 15, further comprising forming an isolation layer under the substrate prior to forming the ground plate.

17. The method of claim 13, further comprising forming a third TSV through the substrate for the feed line of the antenna.

18. The method of claim 13, further comprising forming a third TSV through the substrate for the ground line of the antenna.

19. The method of claim 13, further comprising coupling the first TSV to another die stacked below the substrate in a 3-dimensional (3D) packaging.

20. An antenna comprising:
    a substrate;
    a top plate disposed over the substrate;
    a ground plate disposed below the substrate;
    at least one feed line connected to the top plate, each feed line comprising a first through-silicon via (TSV) structure passing through the substrate; and
    at least one ground line connected to the top plate, each ground line comprising a second TSV structure passing through the substrate,
    wherein the top plate is electrically conductive, the at least one feed line is arranged to carry a radio frequency signal, the at least one feed line is coupled to another die stacked below the substrate in a 3-dimensional (3D) packaging using the first TSV structure, and the at least one ground line is arranged to be coupled to the ground plate.

* * * * *